(12) United States Patent
Kobayashi et al.

(10) Patent No.: US 6,891,407 B2
(45) Date of Patent: May 10, 2005

(54) ANALOG SIGNAL LEVEL DETECTING APPARATUS

(75) Inventors: Taku Kobayashi, Kyoto (JP); Keiichi Fujii, Kusatsu (JP); Takuma Ishida, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/799,668

(22) Filed: Mar. 15, 2004

(65) Prior Publication Data

US 2004/0183709 A1 Sep. 23, 2004

(30) Foreign Application Priority Data

Mar. 18, 2003 (JP) .......................... 2003-073196

(51) Int. Cl.$^7$ .............................................. H03K 5/22
(52) U.S. Cl. ............................................ 327/77; 327/58
(58) Field of Search ............................. 327/50, 56, 57, 327/58, 72, 73, 74, 76, 77; 341/144

(56) References Cited

U.S. PATENT DOCUMENTS

| | | | | |
|---|---|---|---|---|
| 4,302,812 A | * | 11/1981 | Fitch ........................... | 702/64 |
| 4,721,865 A | | 1/1988 | Tallaron et al. ................ | 327/77 |
| 4,973,962 A | * | 11/1990 | Shimizu ....................... | 341/166 |

FOREIGN PATENT DOCUMENTS

JP 2790176 6/1998

* cited by examiner

*Primary Examiner*—Linh My Nguyen
(74) *Attorney, Agent, or Firm*—Stevens, Davis, Miller & Mosher, LLP (57) ABSTRACT

A rectified analog input signal is compared with a threshold voltage by a voltage comparator, and counting direction of an up/down counter is switched based on the comparison result, and a latch circuit retains an output of the up/down counter, and then an analog-digital converting circuit converts an output of the latch signal into a direct-current voltage. In addition, two input terminals, to which a clock for up-count operation and a clock for down-count operation are independently provided, is provided in the up/down counter, and a timing pulse generating circuit for determining reset timing of the up/down counting circuit and latch timing of the latch circuit is provided.

3 Claims, 6 Drawing Sheets

PRIOR ART

FIG. 5

PRIOR ART

FIG. 6

PRIOR ART

US 6,891,407 B2

ANALOG SIGNAL LEVEL DETECTING APPARATUS

BACKGROUND OF THE INVENTION

1. Technical Field

The present invention relates to an analog signal level detecting apparatus for detecting a level of an analog signal, such as an audio signal typically.

2. Prior Art

Figure 4:
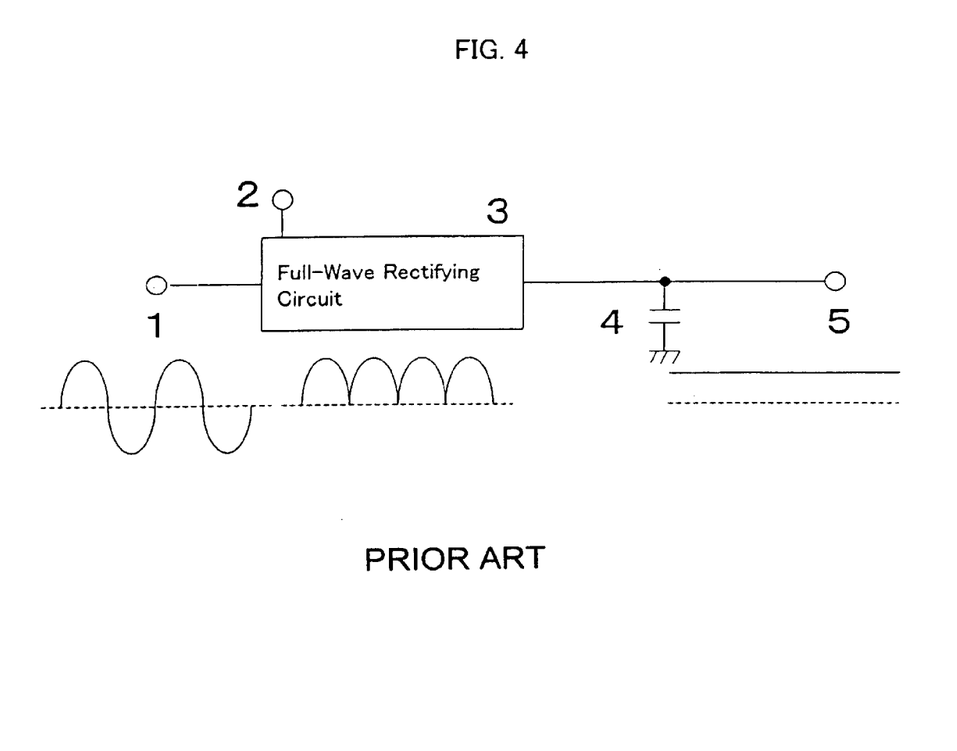
FIG. 4 is a block diagram showing a configuration of an analog signal detecting apparatus of a prior art.

FIG. 4 shows an analog signal level detecting apparatus in a prior art. In FIG. 4, reference numeral 1 shows an input terminal, to which an analog signal is provided. Reference numeral 2 shows a reference bias voltage input terminal, to which a reference bias voltage is provided. Reference numeral 3 shows a full-wave rectifying circuit, which compares the provided analog signal with the provided reference bias voltage and reverses a negative area so as to be positive. Reference numeral 4 shows a capacitor for smoothing, which integrates the rectified voltage obtained by the full-wave rectifying circuit 3 and coverts it into a direct-current (DC) voltage. Reference numeral 5 shows an output terminal of the analog signal level detecting apparatus.

It is an object of the analog signal level detecting apparatus to properly convert the rectified analog signal into a DC voltage by integrating with the capacitor. For that purpose, a time constant determined by the capacitance of the capacitor 2 should be large for the maximum signal cycle of the provided analog signal. As a result, the capacitor 4 has an extremely too large capacitance to be integrated on an integrated circuit.

In order to solve the problem, Japanese Patent No. 2790176 already proposed an analog signal level detecting apparatus, which does not require such a capacitor with a large capacitance incapable of being integrated on an integrated circuit.

Figure 5:
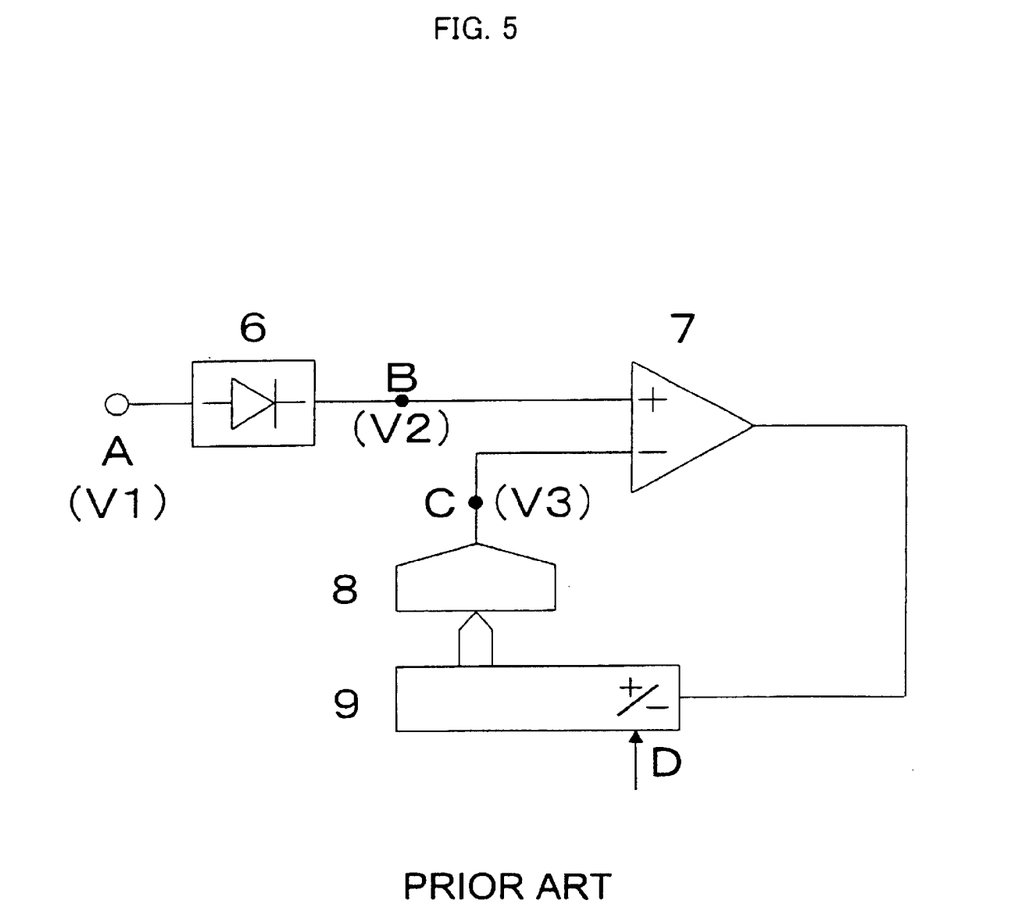
FIG. 5 is a block diagram showing a basic configuration of an analog signal level detecting apparatus shown in Japanese Patent No. 2790176.
Figure 6:
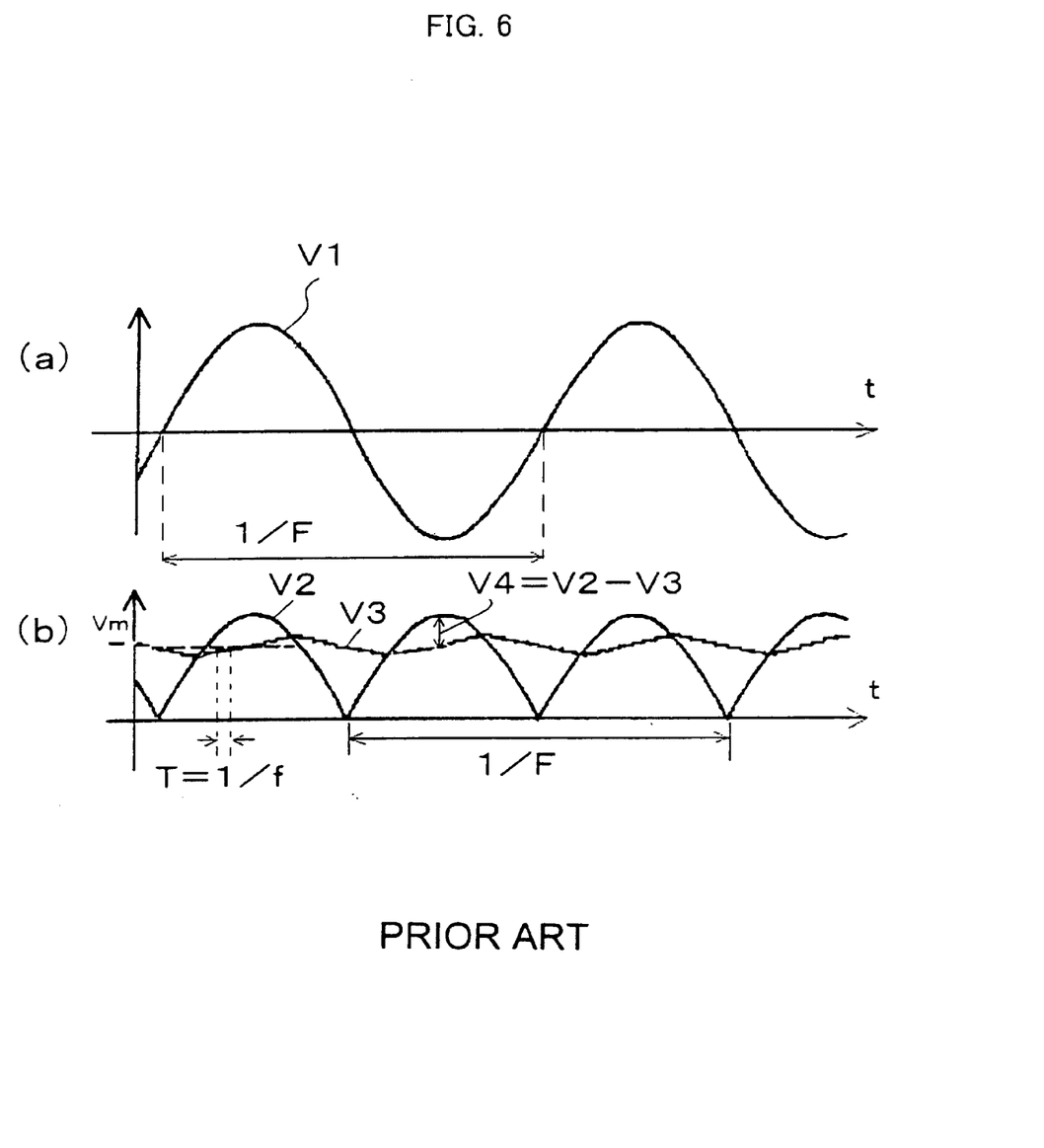
FIG. 6 is a timing wave chart useful for understanding an operation of an analog signal level detecting apparatus shown in Japanese Patent No. 2790176.

FIG. 5 is a block diagram showing a basic circuit configuration of the analog signal level detecting apparatus disclosed in the Japanese Patent No. 2790176. FIG. 6 is a timing wave chart useful for understanding the operation of the analog signal level detecting apparatus shown in FIG. 5. In FIG. 5, reference numeral 6 shows a full-wave rectifier performing full-wave rectification of an analog signal V1. Reference numeral 7 shows a comparator. Reference numeral 9 shows an up/down counter selectively performing an up-count operation and a down-count operation according to a level of an output signal of the comparator 7. Reference numeral 8 shows a digital-analog converter converting the count value of the up/down counter 9 into a DC voltage.

The analog input signal V1 is provided to an input terminal A of the full-wave rectifier 6 and is rectified by the full-wave rectifier 6. An output signal V2, which appears in an output terminal B of the full-wave rectifier 6, becomes a full-wave rectified shape. FIG. 6(a) shows the analog input signal V1 with a sinusoidal wave as one example. Its period is 1/F where F is frequency. In addition, FIG. 6(b) shows the output signal V2 of the full-wave rectifier 6.

The output terminal B of the full-wave rectifier 6 is connected to one input terminal of the comparator 7. Another input terminal of the comparator 7 is connected to an output terminal C of the digital-analog converter 8.

The input terminal of the digital-analog converter 8 is connected to the output terminal of the up/down counter 9. The frequency f of the up-count operation and the down-count operation of this up/down counter 9 is determined by the frequency of the clock signal D provided to the up/down counter 9. An output signal V3 of the digital-analog converter 8 takes a value corresponding to a change of the count value of the up/down counter 9, and is provided to another input terminal of the comparator 7. FIG. 6(b) shows the output signal V3 of the digital-analog converter 8 with overlapping on the output signal V2 of the full-wave rectifier 6.

As seen in FIG. 6, the output signal V3 of the digital-analog converter 8 increases when the up/down counter 9 performs up-count, and decreases when down-count.

In addition, when the output signal V2 of the full-wave rectifier 6 is larger than the output signal V3 of the digital-analog converter 8, the level of the output signal V3 of the digital-analog converter 8 increases at a constant slope. On the other hand, when the output signal V2 of the full-wave rectifier 6 is smaller than the output signal V3 of the digital-analog converter 8, the level of the output signal V3 of the digital-analog converter 8 decreases at a constant slope.

In this case, the output signal V3 of the digital-analog converter 8 increases or decreases at a period 1/f in stages at the same amount every stage. Thus, the slope in increasing is the same as the slope in decreasing.

An average value Vm of the output signal V3 of the digital-analog converter 8 represents an effective value of the input signal.

However, in the analog signal level detecting apparatus disclosed in the Japanese Patent No. 2790176, both the operation frequencies in the up-count operation and the down-count operation of the up/down counter are uniquely determined by the frequency of the common clock signal D. Accordingly, the time inclination when the count value increases is the same as the time inclination when the count value decreases.

Therefore, in the prior art, since the output responsivity for the level change of the analog signal V1 cannot be arbitrarily selected, the output signal V3 of the digital-analog converter 9 representing the effective value of the analog signal V1 varies in stages as a triangle wave.

For example, when the analog signal level detecting apparatus disclosed in the Japanese Patent No. 2790176 is used as means for obtaining a control signal of an audio AGC circuit, which controls a gain according to a level of an analog audio signal, the following situation happens. That is, although the effective value level of the analog input signal V1 is constant, the level of output signal V3 of the digital-analog converter 9 representing the effective value varies as a triangular wave. Accordingly, since the gain of the audio AGC circuit varies according to the change of the triangle wave, the level of the output audio signal of the AGC circuit constantly repeats extension and compression. Therefore, the audio signal causes a feeling that something is wrong.

In addition the digital-analog converter as a preferred embodiment proposed in the above Japanese Patent No. 2790176 is controlled by a switching control signal, which is generated according to the count number of the up/down counter, as a capacitor switching method.

SUMMARY OF THE INVENTION

It is an object of the present invention to provide an analog signal level detecting apparatus capable of selecting output responsivity for a level change of an analog signal without a capacitor.

To solve the problem of the above prior art, an analog signal level detecting apparatus according to the present invention comprises a first voltage comparator for comparing an input signal with a reference voltage; a rectifying circuit for rectifying the input signal; a second voltage comparator for comparing an output signal of the rectifying circuit with a threshold voltage previously arbitrarily specified; an up/down counting circuit, to which a clock for an up-count operation and a clock for a down-count operation are independently provided, for selectively performing an up-count operation or a down-count operation based on an output signal of the second voltage comparator; a first latch circuit for retaining a count value of the up/down counting circuit; a timing pulse generating circuit for generating a timing pulse, which determines reset timing of the up/down counting circuit and retaining timing of the first latch circuit, based on an output signal of the first voltage comparator; a digital-analog converting circuit for converting an output signal of the first latch circuit into a direct-current voltage.

According to this construction, a rectified analog input signal is compared with a threshold voltage, and counting direction of an up/down counter is switched based on the comparison result, and a first latch circuit retains an output of the up/down counter, and then an analog-digital converting circuit converts an output of the first latch signal into a direct-current voltage. Furthermore, two input terminals, to which a clock for an up-count operation and a clock for a down-count operation are independently provided, are provided in the up/down counter, and a timing pulse generating circuit for determining reset timing of the up/down counting circuit and latch timing of the latch circuit is provided. Thus, it is possible to provide an analog signal level detecting apparatus capable of selecting output responsivity for a level change of an analog signal without any capacitors. In addition, even when an output signal of this analog signal level detecting apparatus is used as a control signal of an audio AGC circuit for example, the output audio signal of the AGC circuit does not constantly repeats extension and compression, therefore, it is possible to provide an audio signal without a feeling that something is wrong.

In the analog signal level detecting apparatus according to the present invention, it is preferable that a wave-shaping circuit is provided between the second voltage comparator and the up/down counting circuit, and stops conveying a change of the output signal of the second voltage comparator in time of a period of a clock with a shorter period of the clock for an up-count operation and the clock for a down-count operation to the up/down counting circuit.

According to this construction, a wave-shaping circuit, which is provided between the second voltage comparator and the up/down counting circuit, stops conveying a change of the output signal of the second voltage comparator in time of a period of a clock with a shorter period of the clock for an up-count operation and the clock for a down-count operation to the up/down counting circuit. Accordingly, it is possible to provide a high-precision analog signal level detecting apparatus, which does not respond to a change of an input signal level when the change is shorter than output response time for a level change of an analog input signal specified previously, such as extraneous noise typically.

Additionally, in the analog signal level detecting apparatus according to the present invention, the wave-shaping circuit includes a second latch circuit for performing an updating operation at the period of a clock with a shorter period of said clock for an up-count operation and said clock for a down-count operation, for example.

DETAILED DESCRIPTION OF THE PREFERRED EMBODIMENTS

Embodiment 1

Figure 1:
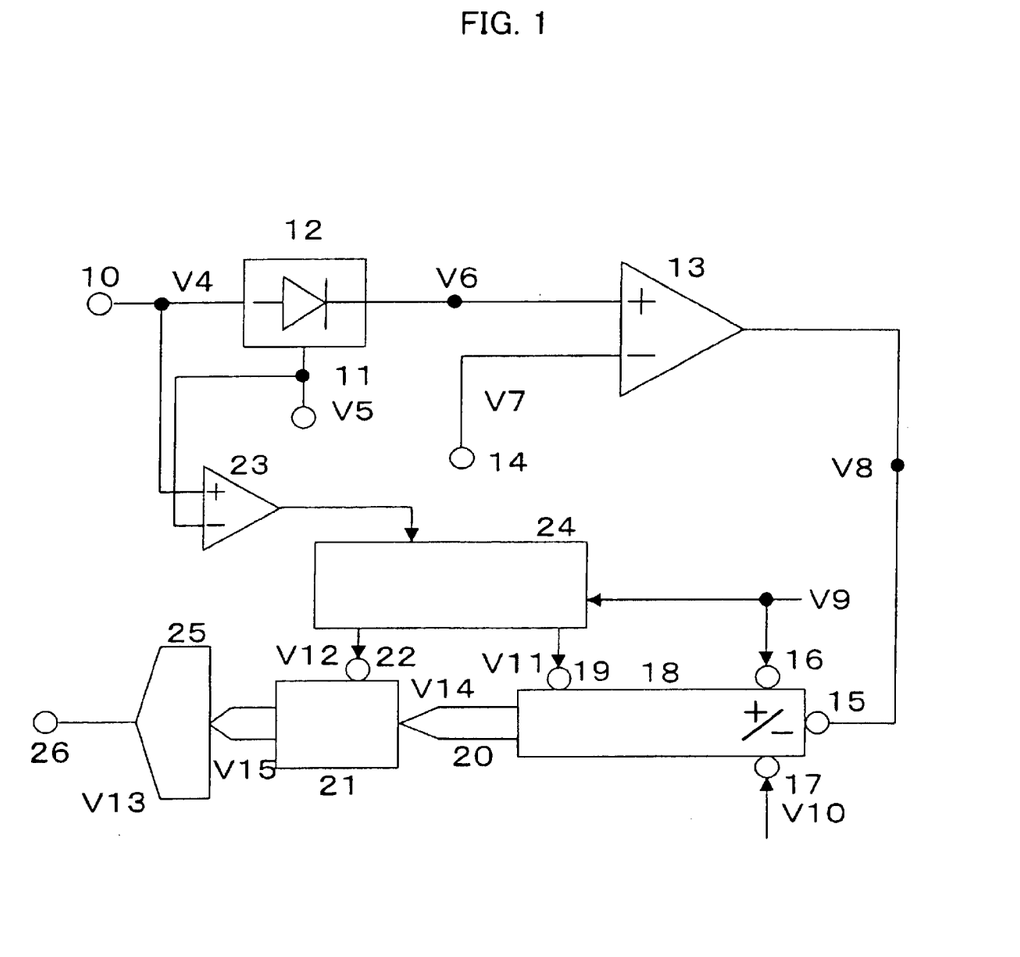
FIG. 1 is a block diagram showing a configuration of an analog signal detecting apparatus according to an embodiment 1 of the present invention.

FIG. 1 is a block diagram showing an analog signal detecting apparatus according to an embodiment 1 of the present invention. In FIG. 1, reference numeral 10 shows an input terminal of an analog input signal V4, and reference numeral 11 shows an input terminal of a reference bias voltage V5.

Reference numeral 12 shows a full-wave rectifying circuit. This full-wave rectifying circuit 12 is provided in order to reverse a negative area of the analog input signal V4 in view from the reference bias voltage V5 so as to be positive by comparing the analog input signal V4 with the reference bias voltage V5.

Reference numeral 13 shows a voltage comparator. This voltage comparator 13 compares an output signal V6 of the full-wave rectifying circuit 12 with a threshold voltage V7 specified previously arbitrarily, and outputs a high-level or a low-level voltage as a control signal V8 according to the comparison result.

Reference numeral 14 shows an input terminal for providing the threshold voltage V7 to the voltage comparator 13.

Reference numeral 18 shows an up/down counting circuit for selecting an up-count operation or a down-count operation according to the control signal V8 provided from the voltage comparator 13 as an input signal.

Reference numeral 15 shows an input terminal for receiving the control signal provided from the voltage comparator 13 as an up/down control signal.

Reference numeral 16 shows an input terminal of a clock for an up-count operation V9.

Reference numeral 17 shows an input terminal of a clock for an down-count operation V10.

Reference numeral 19 shows an input terminal of a reset signal V11 for resetting the up/down counting circuit 18.

Reference numeral 20 shows a digital signal output terminal for a count value of the up/down counting circuit 18.

Reference numeral 21 shows a latch circuit for retaining the digital signal output of the up/down counting circuit 18.

Reference numeral 22 shows an input terminal of a control signal V12 for determining retaining timing of the latch circuit 21.

Reference numeral 23 shows a voltage comparator for comparing the analog signal V4 with the reference voltage V5.

Reference numeral 24 shows a timing pulse generating circuit for determining reset timing of the up/down counting circuit 18 and retaining timing of the latch circuit 21 based on an output of the voltage comparator 23 as input.

Reference numeral 25 shows an analog-digital converting circuit, to which the digital signal output retained by the latch circuit 21 is provided as input, for converting this digital signal into a DC voltage.

Reference numeral 26 shows an output terminal of an output voltage V13 of the analog-digital converting circuit 25.

Figure 2:
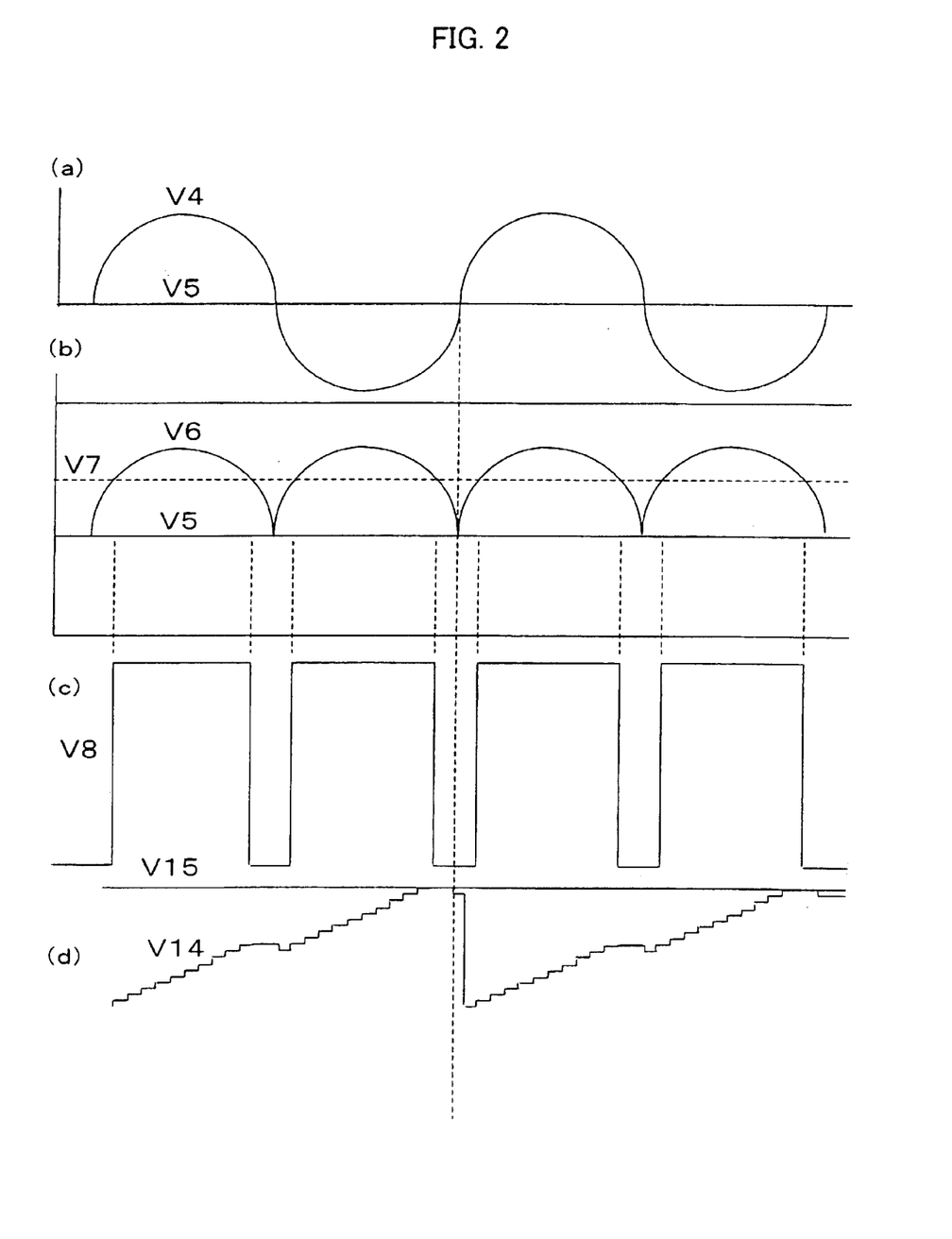
FIG. 2 is a timing wave chart useful for understanding an operation of an analog signal level detecting apparatus according to an embodiment 1 of the present invention.

The following description will describe an operation of this circuit with reference to FIG. 2. The analog input signal V4 (FIG. 2(a)) provided from the input terminal 10 is compared with the reference bias voltage V5 (FIG. 2(a)) supplied from the input terminal 11 in the full-wave rectifying circuit 12, and its negative area is reversed so as to be positive for the reference bias voltage V5. As a result, the output signal V6 (FIG. 2(b)) is obtained by the full-wave rectifying circuit 12. In this operation, it is preferable that the analog input signal V4 provided from the input terminal 10 is a signal biased by the reference bias voltage V5 supplied from the input terminal 11 of the full-wave rectifying circuit 12.

The output signal V6 of the full-wave rectifying circuit 12 is provided to one input terminal of the voltage comparator 13, and is compared with the threshold voltage V7 provided from the threshold voltage input terminal 14 by the voltage comparator 13. The voltage comparator 13 provides a comparison result as the control signal V8 (FIG. 2(c)) for selecting the up-count operation and the down-count operation of the up/down counter 18. Concretely, the voltage comparator 13 provides the control signal V8 of a high level when the output signal V6 of the full-wave rectifying circuit 12 is larger than the threshold voltage V7, and provides the control signal V8 of a low level when the output signal V6 is smaller than threshold voltage V7.

The voltage comparator 23 compares the analog input signal V4 with the reference bias voltage V5. As a result of the comparison, when the analog input signal V4 is larger than the reference bias voltage V5, a high-level signal is provided to the timing pulse generating circuit 24, and when the analog input signal V4 is smaller than the reference bias voltage V5, a low-level signal is provided to the timing pulse generating circuit 24.

The timing pulse generating circuit 24 receives the output signal of the voltage comparator 23 and the clock for an up-count operation V9 as input, and provides the clock for an up-count operation as the reset signal V11 for the up/down counter 18 in first period while the output signal of the voltage comparator 23 is a high level. In addition, the timing pulse generating circuit 24 provides the output signal of the voltage comparator 23 as the latch-timing signal V12 for the latch circuit 21 without being processed.

The up/down counter 18 performs the up-count operation at speed (high-speed) determined by the clock for an up-count operation V9 provided from the terminal 16 while the control signal V8 provided from the input terminal 15 is a high level. Additionally, the up/down counter 18 performs the down-count operation at speed (low-speed) determined by the clock for an down-count operation V10 provided from the terminal 17 while the control signal V8 provided from the input terminal 15 is a low level.

The up-count operation and the down count operation are reset once every one period of the analog input signal V4 with the reset signal V11. The count value V14 of the up/down counter 18 and the output V15 of the latch circuit 21 are shown in FIG. 2(d).

The latch circuit 21 retains the output of the up/down counter 18 at time of rise of the latch-timing signal V12. The digital signal retained in the latch circuit 21 relates to the count value of the up/down counter 18 in one time period. Subsequently, the digital signal retained in the latch circuit 21 is provided as the input of the digital-analog converter 25, and is converted into a DC voltage, and then is provided through the output terminal 26 as a result of level detection of the analog input signal V4 (the output voltage V13 of the digital-analog converter 25).

Since the analog signal level detecting apparatus according to the present invention comprises two input terminals 16 and 17 for receiving the clock for an up-count operation V9 and the clock for an down-count operation V10 independently, and the timing pulse generating circuit 24 for determining the reset timing of the up/down counter 18 and the latch timing of the latch circuit 21, it is possible to freely specify output responsivity for a level change of the analog input signal V4. That is, selecting a frequency of the clock for an up-count operation V9 or the clock for an down-count operation V10 can arbitrarily specify the time inclination when the count value increase and the time inclination when the count value decrease, and they can be deferent from each other. As a result, it is possible to freely specify output responsivity for a level change of the analog input signal V4.

As mentioned above, according to this embodiment, the rectified analog input signal V6 is compared with the threshold voltage V7, and counting direction of the up/down counter 18 is switched based on the comparison result, and the latch circuit 21 retains an output of the up/down counter 18, and then the analog-digital converting circuit 25 converts an output of the latch signal 21 into a DC voltage. Furthermore, two input terminals 16 and 17, to which the clock for up-count V9 and the clock for down-count V10 are independently provided, are provided in the up/down counter 18, and the timing pulse generating circuit 24 for determining reset timing of the up/down counting circuit 18 and latch timing of the latch circuit 21 is provided. Thus, it is possible to provide an analog signal level detecting apparatus capable of selecting output responsivity for a level change of the analog signal V1 without any capacitors.

In addition, when an output signal of this analog signal level detecting apparatus is used as a control signal of an audio AGC circuit for example, the output audio signal of the AGC circuit does not constantly repeats extension and compression, therefore, it is possible to provide an audio signal without a feeling that something is wrong.

Embodiment 2

Figure 3:
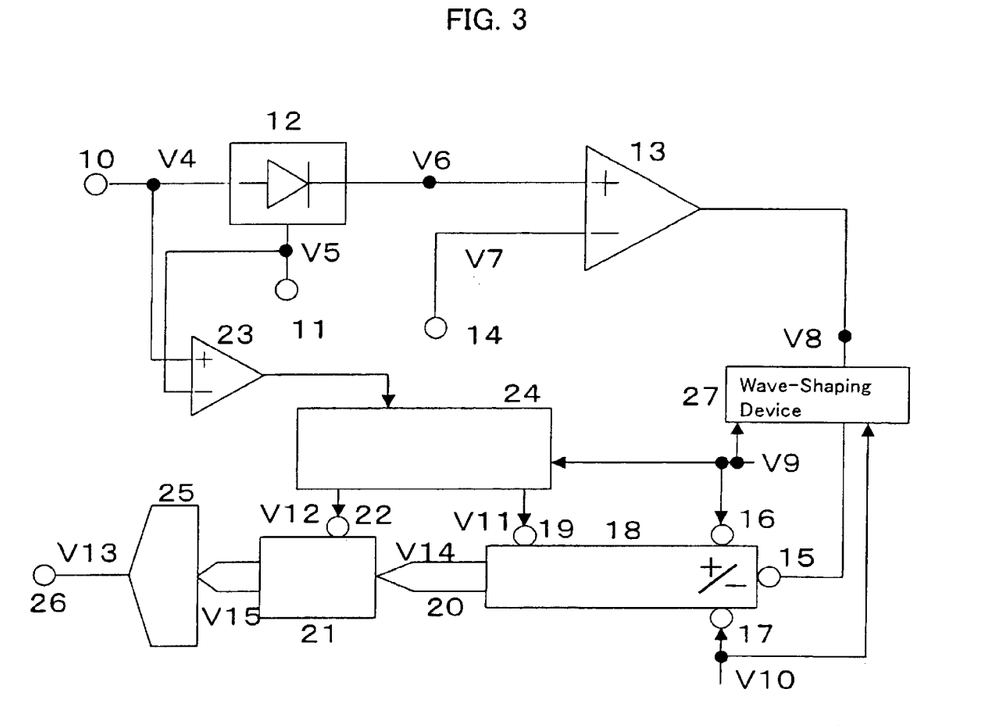
FIG. 3 is a block diagram showing a configuration of an analog signal detecting apparatus according to an embodiment 2 of the present invention.

FIG. 3 is a block diagram showing an analog signal detecting apparatus according to an embodiment 2 of the present invention. In this embodiment, a wave-shaping device 27 is provided between the output end of the voltage comparator 13 and the terminal 15 of the up/down counter 18 as shown in FIG. 3, and the other components are similar to those of the embodiment 1.

This wave-shaping device 27 receives the output signal V8 of the voltage comparator 13, the clock for an up-count operation V9, and the clock for a down-count operation V10 as input. The periods of the clock for an up-count operation V9 and the clock for a down-count operation V10 are measured, respectively, and are compared with each other, and then a clock with a shorter period is selected. A change of the output signal V8 of the voltage comparator 13 in time of the selected period is not conveyed to the up/down counting circuit 18 as the control signal for selecting the up-count operation and the down-count operation.

Concretely, the wave-shaping device 27 measures the clock for an up-count operation V9 and the clock for a down-count operation V10, respectively, and compares them with each other, and then selects a clock with a shorter period. The wave-shaping device 27 detects a change of the output signal V8 of the voltage comparator 13 every one period of the selected clock, and provides it as the control signal for selecting the up-count operation and the down-count operation. In addition, this wave-shaping device 27 includes a latch circuit for performing an updating operation at a shorter clock of the clock for an up-count operation V9 and the clock for an down-count operation V10.

When width relationship between the periods of the clock for an up-count operation V9 and the clock for an down-count operation V10 of the up/down counter 18 is previously specified, one clock with a shorter period of the clock for an up-count operation V9 and the clock for an down-count operation V10 of the up/down counter 18 may be directly provided to the latch circuit as clock input.

According to this embodiment, since the wave-shaping device 27 is provided, it is possible to provide a high-precision analog signal level detecting apparatus, which does not respond to a change of an input signal level when the change is shorter than output response time for a previously-specified level change of the input signal V1, such as extraneous noise.

Beside, a full-wave rectifying circuit is used in the above embodiments, however, a half-wave rectifying circuit may be used.

What is claimed is:

1. An analog signal level detecting apparatus comprising:
   a first voltage comparator for comparing an input signal with a reference voltage;
   a rectifying circuit for rectifying said input signal;
   a second voltage comparator for comparing an output signal of said rectifying circuit with a threshold voltage specified previously arbitrarily;
   an up/down counting circuit, to which a clock for an up-count operation and a clock for a down-count operation are independently provided, for selectively performing an up-count operation or a down-count operation according to an output signal of said second voltage comparator;
   a first latch circuit for retaining a count value of said up/down counting circuit;
   a timing pulse generating circuit for generating a timing pulse, which determines reset timing of said up/down counting circuit and retaining timing of said first latch circuit, based on an output signal of said first voltage comparator;
   a digital-analog converting circuit for converting an output signal of said first latch circuit into a direct-current voltage.

2. The analog signal level detecting apparatus according to claim 1 further comprising a wave-shaping circuit, which is provided between said second voltage comparator and said up/down counting circuit, for stopping conveying a change of the output signal of the second voltage comparator in time of a period of a clock with a shorter period of said clock for an up-count operation and said clock for a down-count operation to said up/down counting circuit.

3. The analog signal level detecting apparatus according to claim 2, wherein said wave-shaping circuit includes a second latch circuit for performing an updating operation at the period of a clock with a shorter period of said clock for an up-count operation and said clock for a down-count operation.

* * * * *